(12) United States Patent
Scheiper et al.

(10) Patent No.: US 8,241,977 B2
(45) Date of Patent: Aug. 14, 2012

(54) SHORT CHANNEL TRANSISTOR WITH REDUCED LENGTH VARIATION BY USING AMORPHOUS ELECTRODE MATERIAL DURING IMPLANTATION

(75) Inventors: Thilo Scheiper, Dresden (DE); Andy Wei, Dresden (DE); Sven Beyer, Dresden (DE)

(73) Assignee: GlobalFoundries Inc., Cayman Islands (KY)

( * ) Notice: Subject to any disclaimer, the term of this patent is extended or adjusted under 35 U.S.C. 154(b) by 98 days.

(21) Appl. No.: 12/692,698

(22) Filed: Jan. 25, 2010

(65) Prior Publication Data

US 2010/0193860 A1 Aug. 5, 2010

(30) Foreign Application Priority Data

Jan. 30, 2009 (DE) .................. 10 2009 006 801

(51) Int. Cl.
*H01L 21/8238* (2006.01)
(52) U.S. Cl. .. 438/216; 438/300; 438/486; 257/E21.202
(58) Field of Classification Search ........... 257/E21.202; 438/216, 217, 300, 486
See application file for complete search history.

(56) References Cited

U.S. PATENT DOCUMENTS

| | | | | |
|---|---|---|---|---|
| 4,479,831 A | 10/1984 | Sandow et al. | ................ | 148/1.5 |
| 5,614,428 A | 3/1997 | Kapoor | ............................ | 437/41 |
| 6,096,614 A | 8/2000 | Wu | ................................ | 438/303 |
| 6,248,675 B1 | 6/2001 | Xiang et al. | .................. | 438/926 |
| 6,344,380 B1 | 2/2002 | Kim et al. | ..................... | 438/197 |
| 2005/0095831 A1 | 5/2005 | Balasubramanyam et al. | ............................. | 438/585 |
| 2007/0069298 A1 | 3/2007 | Lu et al. | ........................ | 257/357 |
| 2008/0026572 A1 | 1/2008 | Wirbeleit et al. | ............. | 438/663 |
| 2008/0076216 A1 | 3/2008 | Pae et al. | ....................... | 438/257 |
| 2008/0121999 A1 | 5/2008 | Kawahara et al. | ............ | 257/366 |

OTHER PUBLICATIONS

Wiatr et al., "Review on Process-Induced Strain Techniques for Advanced Logic Technologies," 15th IEEE International Conference on Advance Thermal Processing of Semiconductors, pp. 19-29, Oct. 2007.
PCT Search Report and Written Opinion from PCT/US2010/022203 dated Sep. 15, 2010.
Translation of Official Communication from German Patent Office for German Patent Application No. 10 2009 006 801.5 dated Apr. 8, 2010.

*Primary Examiner* — Howard Weiss
*Assistant Examiner* — John C Ingham
(74) *Attorney, Agent, or Firm* — Williams, Morgan & Amerson, P.C.

(57) ABSTRACT

In sophisticated transistor elements, enhanced profile uniformity along the transistor width direction may be accomplished by using a gate material in an amorphous state, thereby reducing channeling effects and line edge roughness. In sophisticated high-k metal gate approaches, an appropriate sequence may be applied to avoid a change of the amorphous state prior to performing the critical implantation processes for forming drain and source extension regions and halo regions.

19 Claims, 10 Drawing Sheets

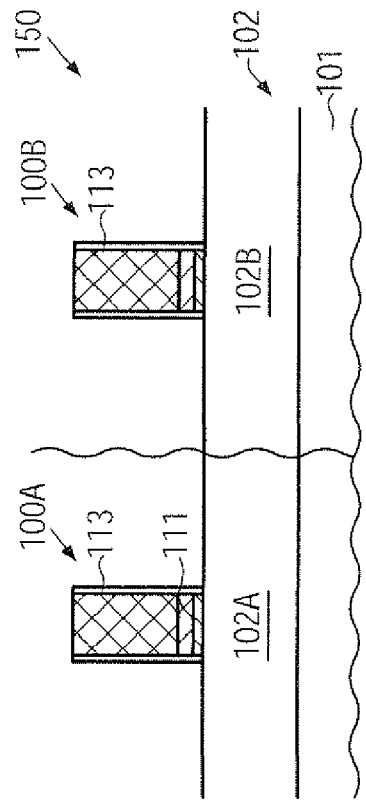
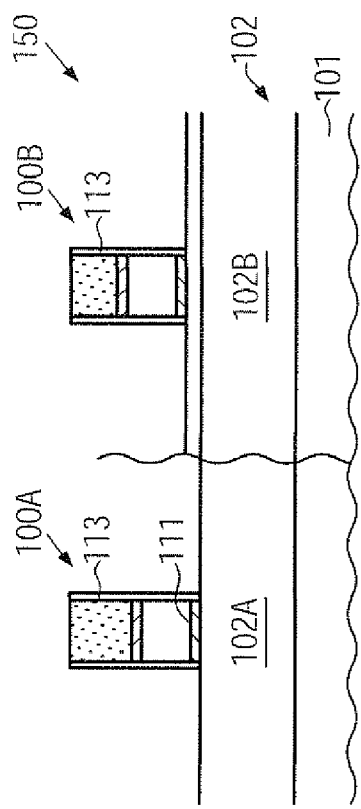
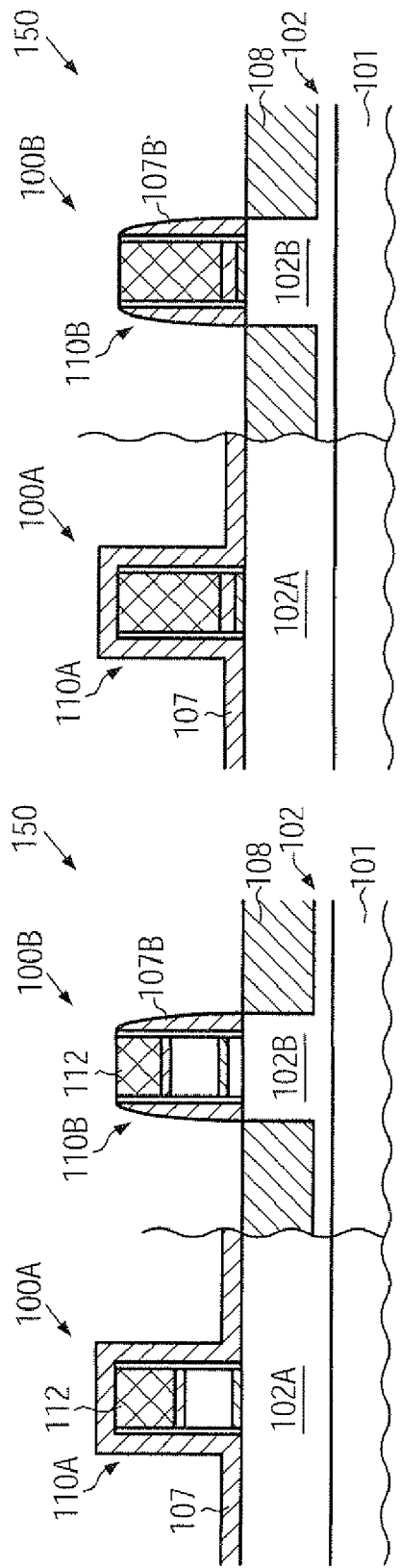

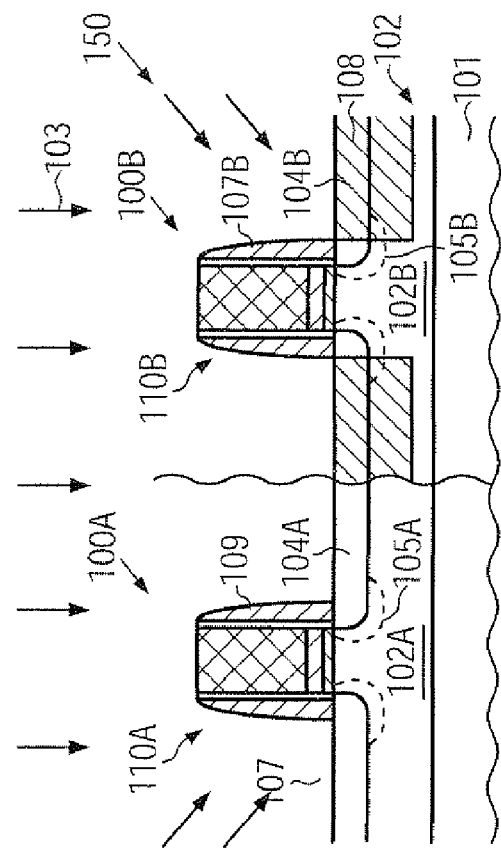
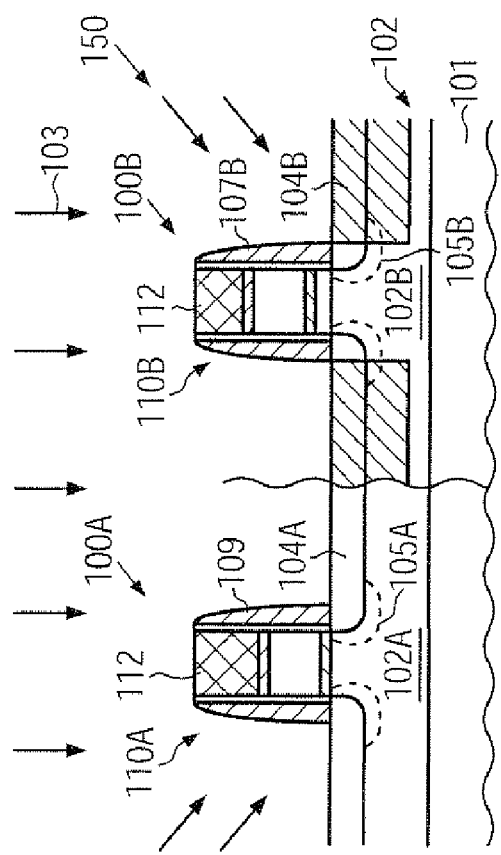
FIG. 1m (prior art)
FIG. 1n (prior art)

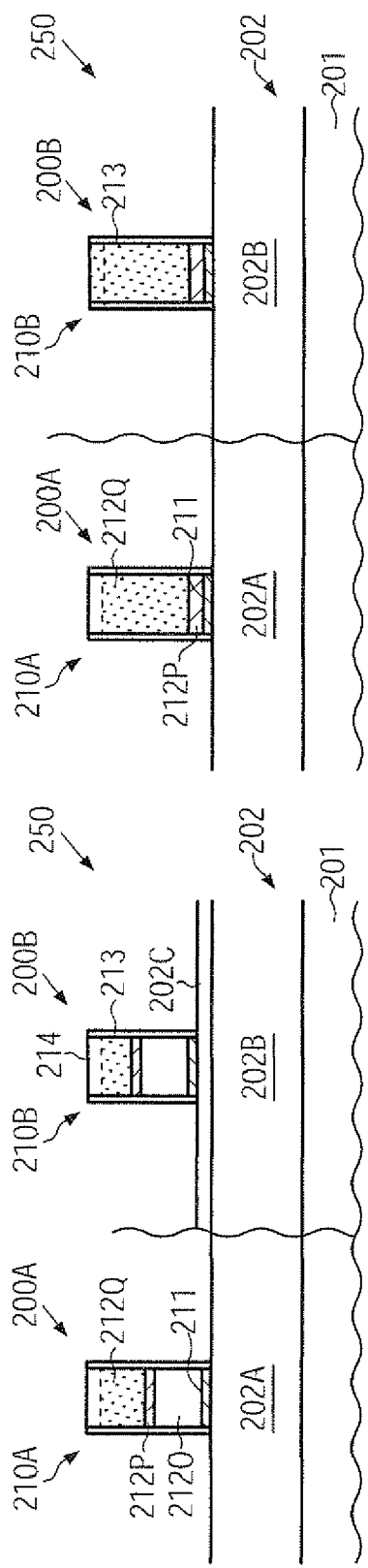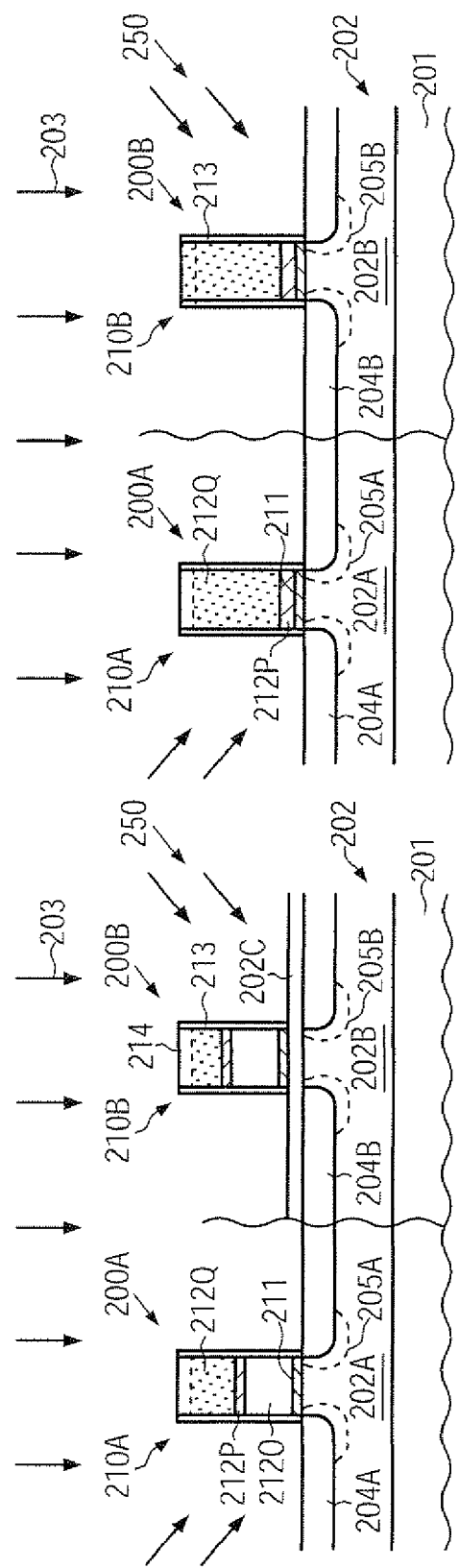

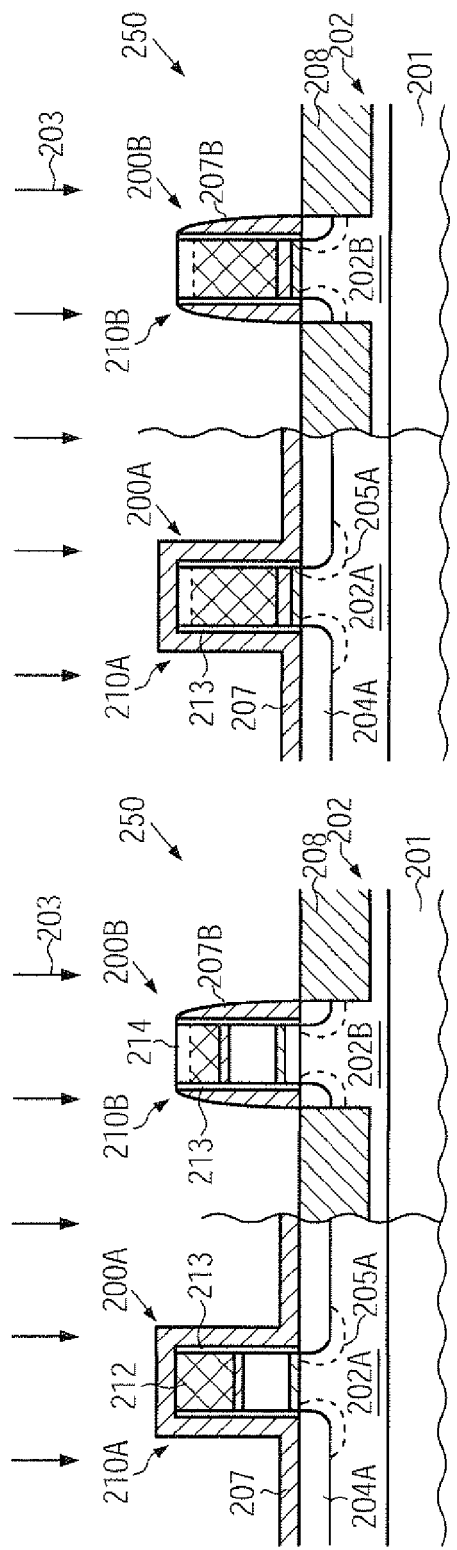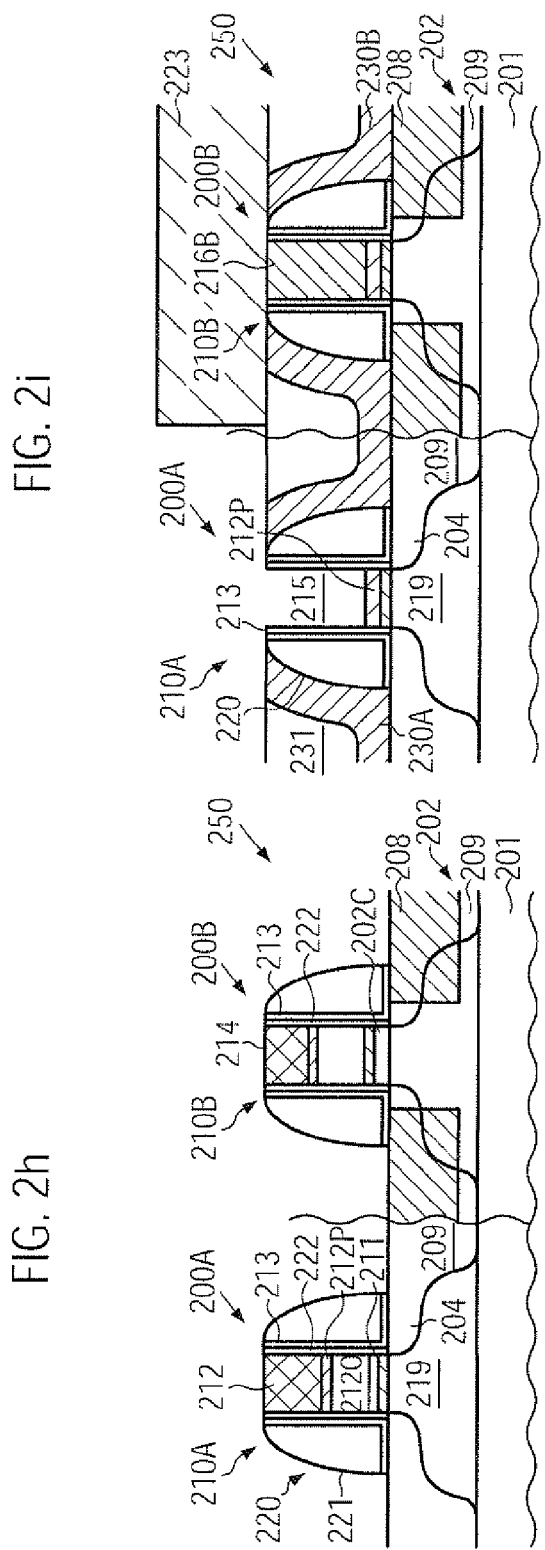

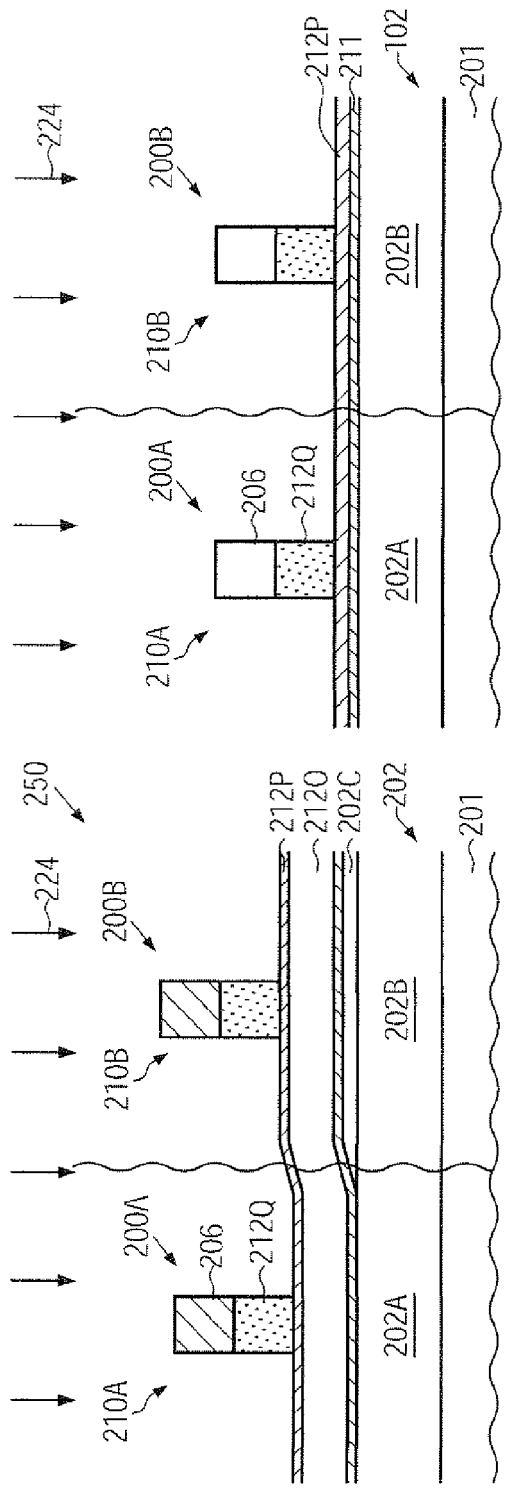

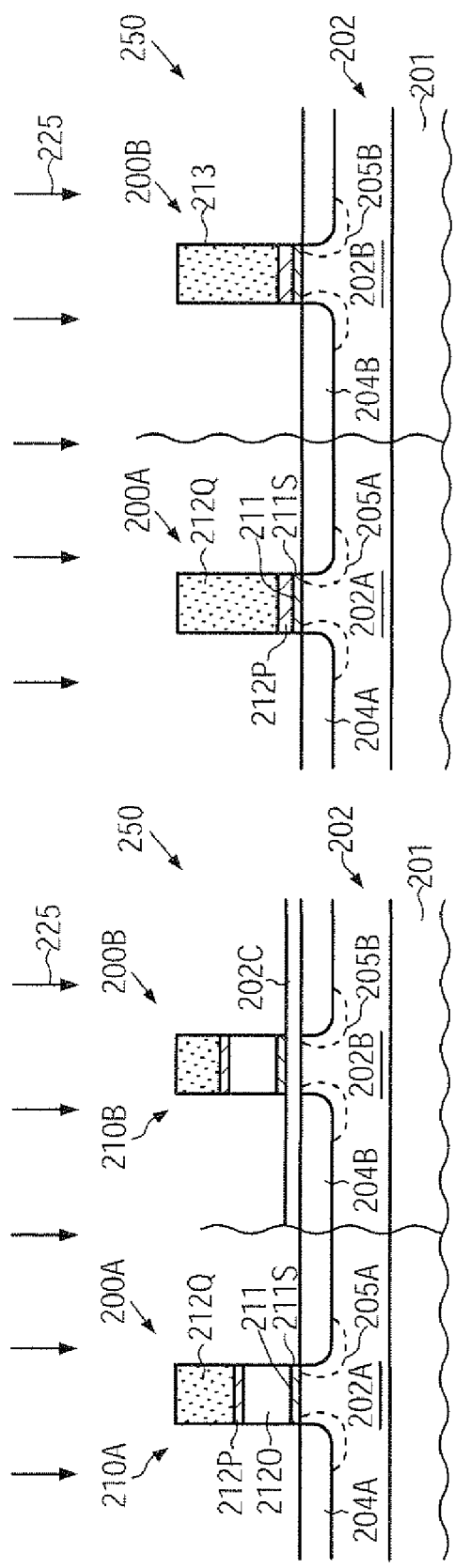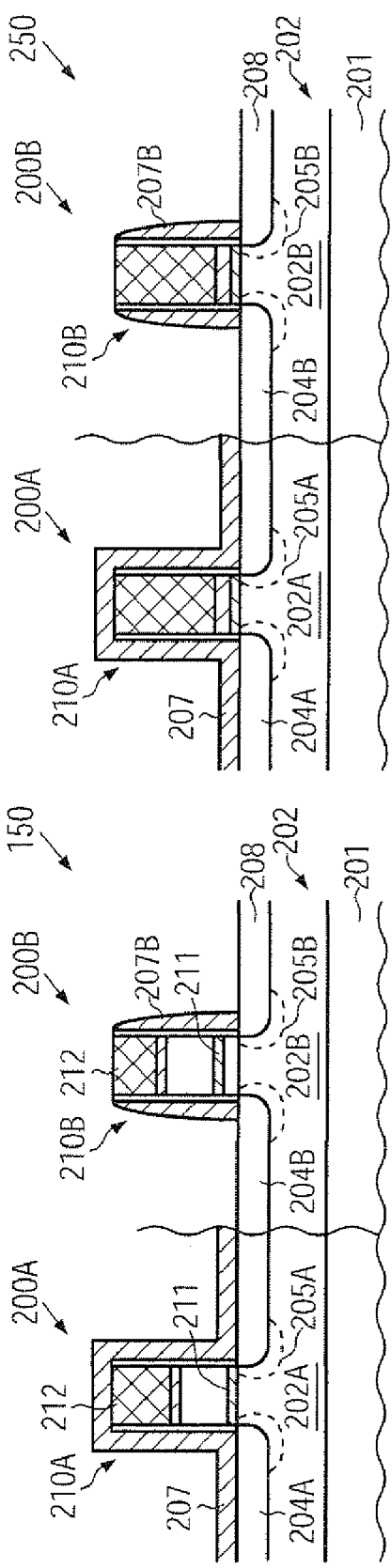

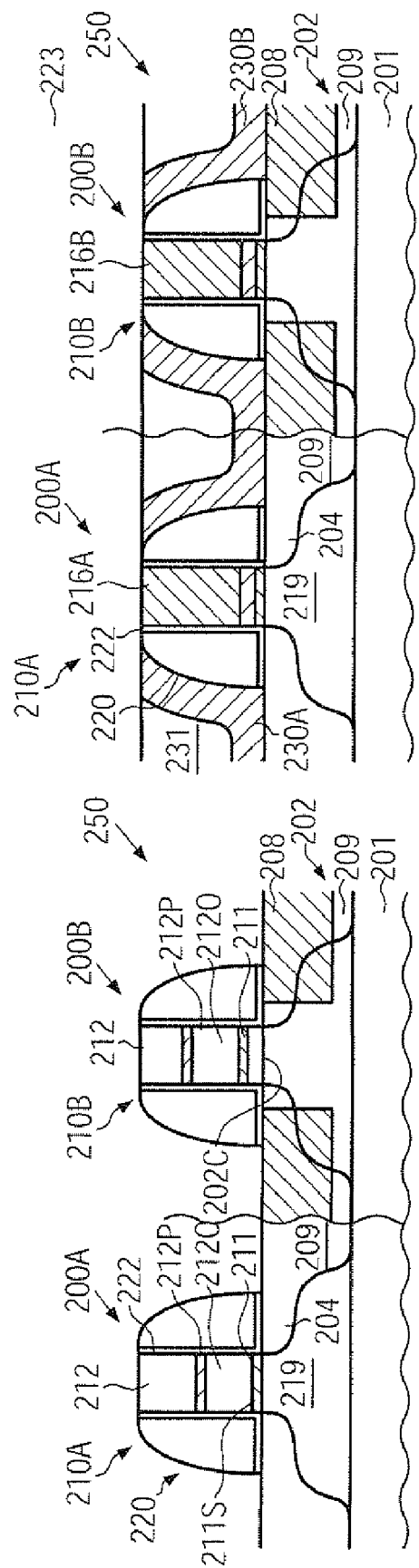

SHORT CHANNEL TRANSISTOR WITH REDUCED LENGTH VARIATION BY USING AMORPHOUS ELECTRODE MATERIAL DURING IMPLANTATION

BACKGROUND OF THE INVENTION

1. Field of the Invention

Generally, the present disclosure relates to the sophisticated integrated circuits including short channel transistor elements comprising highly capacitive gate structures on the basis of a metal-containing electrode material and a high-k gate dielectric of increased permittivity compared to conventional gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, the usage of high speed transistor elements having an extremely short channel may preferably be restricted to high speed signal paths, whereas transistor elements with a longer channel may be used for less critical circuit portions, such as storage transistor elements, the relatively high leakage current caused by direct tunneling of charge carriers through an ultra-thin silicon dioxide gate insulation layer may nevertheless reach values for an oxide thickness in the range or 1-2 nm that may not be compatible with thermal design power requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Therefore, it has been suggested to replace silicon dioxide with high permittivity materials such as tantalum oxide ($Ta_2O_5$) with a k of approximately 25, strontium titanium oxide ($SrTiO_3$) having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same or greater thickness as a silicon dioxide layer, while additionally maintaining leakage currents at an acceptable level. On the other hand, the non-polysilicon material, such as titanium nitride and the like, in combination with other metals, such as titanium, aluminum and the like, may be formed so as to connect to the high-k dielectric material, thereby substantially avoiding the presence of a depletion zone.

Since, typically, a low threshold voltage of the transistor, which represents the voltage at which a conductive channel forms in the channel region, is desired to obtain the high drive currents, commonly the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to increase the resulting PN junction dopant gradient by this counter-doping in combination with respective extension and deep drain and source regions. In this way, the threshold voltage of the transistor significantly determines the controllability of the channel, wherein a significant variance of the threshold voltage may be observed for reduced gate lengths. Hence, by providing a precisely positioned halo or counter-doped implantation region in combination with well-controlled extension regions, the controllability of the channel may be enhanced, thereby also reducing the variance of the threshold voltage, which is also referred to as threshold roll-off, and also reducing significant variations of transistor performance with a variation in gate length.

Upon further reduction of the gate length, for instance for transistor elements having a gate length of approximately 40 nm and less, however, a significant variability of transistor characteristics may be observed and may be in part caused by a corresponding variability of the dopant profile of drain and source extension regions and the corresponding counter-doped regions. A corresponding pronounced variability may be caused by the material characteristics of the polysilicon material, which may act as an implantation mask during the sophisticated implantation sequence, as will be described in more detail with reference to FIGS. 1a-1d.

FIG. 1a schematically illustrates a perspective view of a transistor element in a manufacturing stage prior to forming a complex dopant profile, which may include the implantation of a counter-doping species and a dopant species for drain and source extension regions, as explained above. As illustrated, the transistor 100 may comprise an active region 102 which may represent a portion of a semiconductor layer, such as a silicon layer, which may receive an appropriate dopant concentration profile so as to obtain the desired transistor behavior. The active region or semiconductor region 102 is provided above a substrate 101, which may represent a crystalline semiconductor material, an isolating material and the like. Moreover, a gate electrode structure 110 is formed on the active region 102 according to specific design dimensions, that is, the gate electrode structure 110 may have an average gate length as required by the design rules, which may be approximately 40 nm and less in extremely scaled semiconductor devices. The gate electrode structure 110 may comprise a gate insulation layer 111, which may represent a conventional dielectric material, such as silicon dioxide and the like, while, in other cases, sophisticated high-k dielectric materials may be used, as will be described later on in more detail. Furthermore, a polysilicon electrode material 112 is formed on the gate insulation layer 111 in accordance with well-established manufacturing strategies. As illustrated, the polysilicon material 112 may have a plurality of crystalline portions or grains 112A, 112N, which may have a different crystallographic orientation due to the polycrystalline nature of the material 112. Furthermore, due to the different crystallographic orientations of the various grains 112A, 112N, a pronounced "roughness" of sidewalls 112S of the material 112 may be created during the patterning of the material 112, which may be caused by a different etch behavior since, typically, corresponding grain boundaries may etch more efficiently compared to grain internal areas. The corresponding roughness of the sidewall 112S may be less critical for greater device dimensions and may, however, become increasingly important upon further device scaling since the intrinsic roughness of the material 112 may result in a corresponding variability of the complex dopant profiles.

That is, forming the gate electrode structure 110, may be accomplished by well-established manufacturing techniques for depositing or otherwise forming the gate insulation layer 111 and depositing the polysilicon material 112, for instance on the basis of well-established low pressure chemical vapor deposition (CVD) techniques, in order to obtain the polycrystalline state of the material 112, which may be advantageous in view of the conductivity of the material 112. Thereafter, sophisticated lithography techniques may be used in order to form a corresponding etch mask on the basis of which an appropriate sophisticated etch sequence may be performed to pattern the gate electrode material 112, thereby obtaining the configuration as shown in FIG. 1a.

FIG. 1b schematically illustrates the transistor 100 during a sophisticated implantation sequence 103, during which drain and source extension regions 104 may be generated by incorporating an appropriate dopant species, wherein the gate electrode material 112 acts as an implantation mask. Furthermore, the sequence 103 may also comprise one or more implantation steps for incorporating a counter-doping species to form counter-doped or halo regions 105, which, in combination with the regions 104, may define a portion of a PN junction and may thus have a significant influence on the overall performance of the transistor 100, as discussed above. For this purpose, typically, the implantation sequence 103 may comprise implantation steps performed on the basis of a tilt angle, that is, a non-zero angle with respect to the surface normal of the active region 102 so that a corresponding ion species may also be positioned below the gate electrode within the active region 102. It should further be appreciated that the regions 104 may be formed on the basis of a tilted implantation process, if required, for instance when an asymmetric configuration may have to be formed for the extension regions 104 and the like. Consequently, during the sequence 103, the electrode material 112 may "shadow" a portion of the active region 102, wherein a corresponding roughness of the sidewalls 112S (FIG. 1a) may be "imaged" in a more or less diffused manner into a corresponding implantation profile.

FIG. 1c schematically illustrates a corresponding effect of the line roughness of the material 112 along the transistor width direction, indicated as W. It should be appreciated that, for convenience, the gate electrode material 112 is not shown in FIG. 1c. In addition to the variability of the dopant profiles along the transistor width direction caused by the initial roughness of the material 112, an additional contribution to dopant variability may be caused by the polycrystalline nature of the material 112. That is, a varying degree of channeling may occur during the preceding implantation sequence, in particular during the preceding tilted implantation steps. That is, if the direction of an ion beam impinging a material may be in close proximity to a major crystallographic axis of the material, the penetration behavior may significantly differ from a penetration into a disordered material since the positive ions, when encountering a corresponding potential created by a crystallographic axis, may suffer from a significantly reduced degree of interaction, thereby penetrating deeply into the depth of the material. Consequently, due to the presence of the plurality of different crystallographic orientations of the various grains 112A, 112N (FIG. 1*a*), the channeling effect may also vary along the transistor width direction, thereby further contributing to the corresponding variability of the dopant profile due to a varying lateral and vertical penetration depth.

FIG. 1*d* schematically illustrates the effect of a varying channeling behavior.

Since both effects, i.e., the initially created line roughness and the different channeling effect may be independent of each other, both effects may result in an even further pronounced dopant variability, which may thus significantly affect the resulting transistor performance, as explained above.

Thus, upon further scaling the gate length of transistor elements, this effect may become more pronounced and may also have a significant influence on transistor elements in which additional performance enhancing mechanisms may be implemented, such as a sophisticated gate electrode structure, possibly in combination with strain-inducing mechanisms, as will be described in more detail with reference to FIGS. 1*e*-1*n*.

FIG. 1*e* schematically illustrates a cross-sectional view of a semiconductor device 150 comprising an N-channel transistor 100A and a P-channel transistor 100B at an early manufacturing stage. In this manufacturing stage, a sophisticated layer stack is formed above the semiconductor layer 102, which may comprise appropriate active regions 102A, 102B for the transistors 100A, 100B. The layer stack may comprise a gate insulation layer 111 comprising a high-k dielectric material, which may be one or more of the above-mentioned materials, possibly in combination with a conventional dielectric material, such as silicon dioxide and the like. Furthermore, a metal-containing material may be formed on the gate insulation layer 111 which may comprise any appropriate metal-containing material or combinations of different metal species so as to obtain an appropriate work function for the transistor 100A, which may be important for adjusting transistor characteristics, such as the threshold voltage, in combination with a sophisticated dopant profile, as explained above. Furthermore, a conductive barrier material 120P, such as titanium nitride and the like, may be formed on an electrode material 112O. Moreover, a silicon-based electrode material 112Q may be formed on the barrier layer 120P. Additionally, an etch mask 106 is formed above the active regions 102A, 102B to define the lateral position and size of a gate electrode structure still to be formed on the basis of the underlying materials. It should be appreciated that the semiconductor device 150 according to FIG. 1*e* may represent a sophisticated manufacturing strategy for providing a high-k metal gate configuration at an early manufacturing stage, which may be patterned on the basis of the mask 106 and may not require any further material replacement at a later manufacturing stage. In this case, the work function defined by the electrode material 112O may not be appropriate for the transistor 100B and thus typically a semiconductor alloy 120C may be formed on the active region 102B in order to provide a desired band gap offset to obtain an appropriate threshold voltage in combination with the material 112O. For example, a silicon/germanium alloy with a specified thickness and germanium concentration may be used.

The semiconductor device 150 as shown in FIG. 1*e* may be formed on the basis of well-established process techniques, i.e., the semiconductor layer 120C may be formed on the basis of epitaxial growth techniques, wherein a corresponding growth on the active region 102A may be avoided by providing an appropriate growth mask. Thereafter, the gate insulation layer 111 may be formed by deposition and the like, followed by the deposition of the electrode material 112O, which may include a plurality of separate deposition steps, depending on the complexity of the material 112O. Thereafter, the barrier layer 120P may be formed, for instance, by sputter deposition, CVD and the like, followed by the deposition of the material 112Q in the form of a silicon material, which may be provided in the form of an amorphous silicon material due to its reduced thickness and due to moderately low deposition temperatures used. Thereafter, the etch mask 106 may be formed on the basis of well-established lithography techniques.

FIG. 1*f* schematically illustrates the semiconductor device 150 according to a further alternative manufacturing strategy in which a high-k dielectric material is provided in an early manufacturing stage, while a metal-containing material may be formed after completing the basic transistor configuration. In this case, the transistors 100A, 100B may have substantially the same configuration except for the conductivity type of the active regions 102A, 102B. That is to say, the gate insulation layer 111 comprising the high-k dielectric material may be formed on the active regions 102A, 102B, followed by a metal-containing barrier material, such as titanium nitride and the like, indicated as 112P, which may also be used in the device 150 of FIG. 1*e*. Furthermore, the silicon material 112, which may be replaced in a later manufacturing stage, may be provided in a polycrystalline state in conformity with well-established manufacturing techniques.

FIGS. 1*g* and 1*h* schematically illustrate the semiconductor device 150 of FIGS. 1*e* and 1*f*, respectively, in a further advanced manufacturing stage. As illustrated, the device 150 of FIG. 1*g* may comprise gate electrode structures 100A, 100B, respectively, which may include the complex layer stack as described with reference to FIG. 1*e*, wherein, in particular, the amorphous material 112Q may be present. Similarly, the gate electrode structures 100A, 100B of the device 150 of FIG. 1*h* may include the polysilicon material 112 of the corresponding patterning sequence.

FIGS. 1*i* and 1*j* schematically illustrate the semiconductor devices 150 of FIGS. 1*g* and 1*h*, respectively, in a further advanced manufacturing stage. As illustrated, a sidewall liner material 113 may be formed on sidewalls of the gate electrode structures 100A, 100B to provide integrity of the sensitive high-k gate insulation layer 111 during the further processing. As is well known, during the fabrication of complex semiconductor devices, a plurality of wet chemical etch steps may have to be performed, for instance, in view of cleaning surface areas, removing resist material and the like. Frequently, well-established chemical agents, such as diluted hydrofluoric acid (HF) and the like, may be used for removing contaminants and silicon dioxide-based material with high efficiency. Similarly, a mixture of sulphuric acid and hydrogen peroxide may frequently be used for removing resist materials. These well-approved chemical agents may, however, result in a significant material erosion of the high-k materials so that a corresponding protection of any exposed surface areas thereof may be required. For this purpose, typically, the liner material 113 may be formed on the basis of silicon nitride with a thickness of one to several nanometers, which may be accomplished on the basis of sophisticated thermally activated CVD techniques at a temperature of 600° C. and less, followed by an anisotropic etch step for removing the material from horizontal device portions.

FIGS. 1k and 1l schematically illustrate the semiconductor device 150 of FIGS. 1i and 1j, respectively, in a further advanced manufacturing stage in which a strain-inducing mechanism may be established, at least in one of the transistors 100A, 100B in accordance with well-established strategies. As illustrated, the transistors 100A in FIGS. 1k and 1l may be covered by a spacer layer 107, such as a silicon nitride layer, while the transistors 100B may have formed a corresponding sidewall spacer element 107B on sidewalls of the gate electrode structures 100B. Furthermore, a silicon/germanium alloy 108 is formed in the active regions 102B in FIGS. 1k and 1l in order to induce a desired type of strain, such as a compressive strain, below the gate electrode structures 100B. As is well known, a certain type of strain may significantly modify the charge carrier mobility of a silicon-based semiconductor material so that, upon appropriate selection of a strain component, overall transistor performance may be enhanced. In the example shown, P-channel transistors 100B may receive enhanced charge carrier mobility and thus an increased drive current upon creating a compressive strain below the gate electrode structures 100B.

The semiconductor devices 150 of FIGS. 1k and 1l may be formed on the basis of the following processes. First, the spacer layer 107 may be deposited by well-established thermally activated CVD techniques in which typically a moderately high temperature of above 600° C. may have to be applied in order to obtain a desired high material density so as to withstand an etch attack of an etch chemistry to be used for forming corresponding cavities in the transistors 100B in a further advanced manufacturing stage. Thus, during this deposition process performed on the basis of elevated temperatures, the material 112Q (FIG. 1g) may be converted into a polysilicon material, indicated as 112 in the device 150 of FIG. 1k. As previously discussed, due to the polycrystalline nature, a corresponding pronounced line edge roughness may be created. After the deposition of the spacer layer 107, the transistors 100A may be masked by a resist material and an anisotropic etch process may be performed to obtain the spacer elements 107B in the transistors 100B. After removal of the resist mask, cavities (not shown) may be formed in the transistors 100B, while the mask 107 and the spacers 107B, possibly in combination with the mask material formed on the material 112 (not shown), may act as an etch mask. In other cases, the material of the gate electrode material 112 may be removed during the corresponding etch process. Next, a selective epitaxial growth process may be performed, thereby depositing the silicon/germanium alloy 108 in a strained state.

FIGS. 1m and 1n schematically illustrate the semiconductor device 150 of FIGS. 1k and 1l, respectively, in a further advanced manufacturing stage. As illustrated, the device 150 is subjected to an implantation sequence 103 in order to form corresponding extension regions 104A, 104B and halo regions 105A, 105B, respectively. It should be appreciated that the implantation sequence 103 may comprise the corresponding masking regime for separately introducing an appropriate dopant species and counter-dopant species into the active regions 102A and 102B.

As previously discussed with reference to FIGS. 1a-1d, the polycrystalline nature of the material 112 may result in a significant variation of the dopant profile along the transistor width direction. For this purpose, frequently, an offset spacer 109 may be formed on sidewalls of the gate electrode structures 100A, 100B after the removal of the spacer layer 107 and the spacer element 107B (FIGS. 1k, 1l). The offset spacer elements 109, such as silicon dioxide spacers and the like, may be deposited with an appropriate thickness so as to at least significantly reduce the channeling effect caused by the polycrystalline material which, however, may require a specific width of the spacer elements 109. On the other hand, the pronounced variability of thickness, i.e., the line edge roughness previously discussed, may be even further pronounced by additional thickness variations during the deposition of a corresponding spacer material for the sidewall spacers 109. Thus, although the degree of channeling may be reduced, however, at the cost of an additional "blurring" of the incoming ion beam, a further pronounced variability of the resulting dopant profiles of the extension regions 104A, 104B and the counter-doped regions 105A, 105B may be created.

Consequently, upon further processing of the device 150, a corresponding variability of transistor characteristics may also be created in the finalized transistors 100A, 100B, irrespective of whether the approach of providing the sophisticated gate electrode structures 110A, 110B on the basis of the complex layer stack as shown in FIG. 1e, or the approach of replacing the material 112 in a very advanced manufacturing stage may be taken.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides methods and semiconductor devices in which transistor variability caused by gate thickness variation along a transistor width direction may be significantly reduced by providing a gate material in an amorphous state, which may be preserved during subsequent implantation sequences for forming drain and source extension regions and counter-doped regions. The amorphous state of the gate material, which may represent an actual electrode material or a placeholder material, which may be replaced by metal-containing electrode material in a later manufacturing stage, may result in significantly enhanced conditions during the patterning of the gate electrode structure and also during the subsequent implantation process, in which any channeling effects may be suppressed without requiring dedicated offset spacers for the implantation process. Furthermore, the line edge roughness may be significantly less pronounced due to the amorphous state of the gate material compared to polysilicon material as used in conventional strategies, thereby also contributing to a reduced variability along the transistor width direction. In some illustrative aspects disclosed herein, the concept of using an amorphous gate material during patterning the basic gate electrode structure and during the subsequent implantation for forming drain and source extension regions and counter-doped regions may be applied to sophisticated electrode structures in which high-k dielectric materials in combination with metal-containing electrode materials may be used. In other illustrative aspects disclosed herein, a further enhancement of the masking effect of a gate material may be achieved by omitting a spacer liner that may conventionally be required for preserving integrity of a sophisticated high-k dielectric material, which, however, may conventionally also contribute to a further increase of the overall line edge roughness.

One illustrative method disclosed herein comprises forming a gate electrode structure of a transistor above a semiconductor layer, wherein the gate electrode structure comprises a gate material in an amorphous state that is formed above a gate insulation layer. The method further comprises forming a portion of drain and source regions of the transistor by using the gate material in the amorphous state as an implantation mask. Finally, one or more processes are performed to complete the transistor.

A further illustrative method disclosed herein comprises forming a gate electrode structure by forming an amorphous gate material above a high-k dielectric material that is formed above a semiconductor layer of a semiconductor device. The method additionally comprises forming a portion of drain and source regions of a transistor in the semiconductor layer by using the amorphous gate material as an implantation mask. Finally, a plurality of processes are performed to finish a final configuration of the transistor.

One illustrative transistor device disclosed herein comprises a gate electrode structure which comprises a high-k gate insulation material formed above a channel region of the transistor and a metal-containing material formed on the high-k gate insulation material. The gate electrode structure further comprises at least one metal-containing electrode material formed on the metal-containing material. Additionally, the transistor device comprises a sidewall spacer structure formed on sidewalls of the gate electrode structure, wherein the sidewall spacer structure comprises an etch stop liner formed on the sidewall of a high-k dielectric material and a spacer element formed on the etch stop liner.

BRIEF DESCRIPTION OF THE DRAWINGS

The disclosure may be understood by reference to the following description taken in conjunction with the accompanying drawings, in which like reference numerals identify like elements, and in which:

FIGS. 1e, 1g, 1i, 1k and 1m schematically illustrate a semiconductor device during various manufacturing stages in forming transistor elements including a sophisticated high-k metal gate structure that may be formed in an early manufacturing stage, according to conventional strategies;

FIGS. 1f, 1h, 1j, 1l and 1n schematically illustrate the semiconductor device at various manufacturing stages in forming a high-k metal gate structure according to a replacement gate approach, according to conventional techniques;

FIGS. 2d, 2f, 2h and 2j schematically illustrate cross-sectional views of a semiconductor device during various manufacturing stages in forming a high-k metal gate structure at an early manufacturing stage on the basis of an amorphous gate material, according to illustrative embodiments;

FIGS. 2e, 2g, 2i and 2k schematically illustrate cross-sectional views of the semiconductor device during various manufacturing stages for forming a high-k metal gate structure according to a replacement gate approach on the basis of an amorphous gate material, according to further illustrative embodiments;

FIGS. 2l, 2n, 2p, 2r and 2t schematically illustrate cross-sectional views of the semiconductor device during various manufacturing stages in which a high-k metal gate structure may be formed on the basis of an amorphous gate material and without requiring a sidewall liner, according to still further illustrative embodiments; and FIGS. 2m, 2o, 2q, 2s and 2u schematically illustrate the semiconductor device during various manufacturing stages in applying the concept of avoiding the sidewall liner to a replacement gate approach, according to still further illustrative embodiments.

Figure 1A:
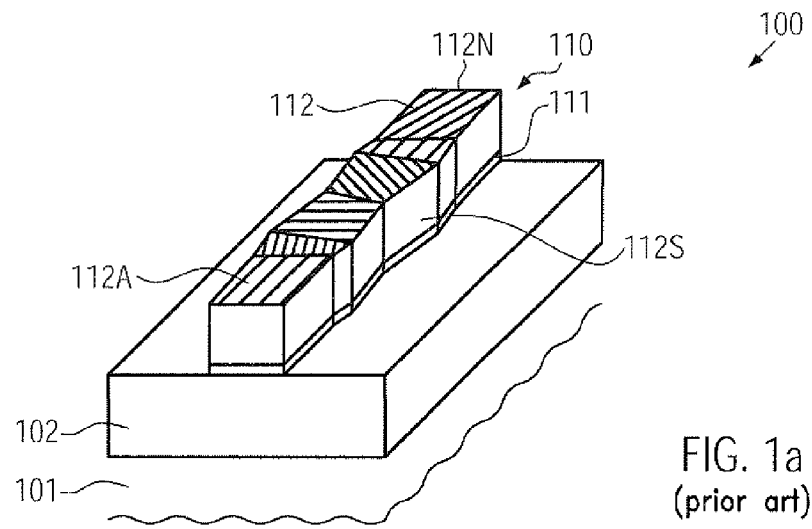
FIGS. 1a-1d schematically illustrate perspective views of a transistor device during various manufacturing stages in forming drain and source extension regions on the basis of conventional process strategies.
Figure 1B:
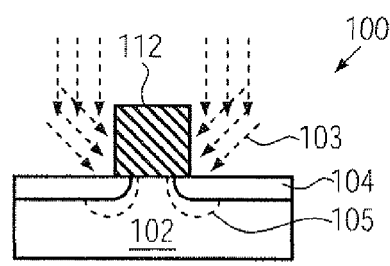
Figure 1C:
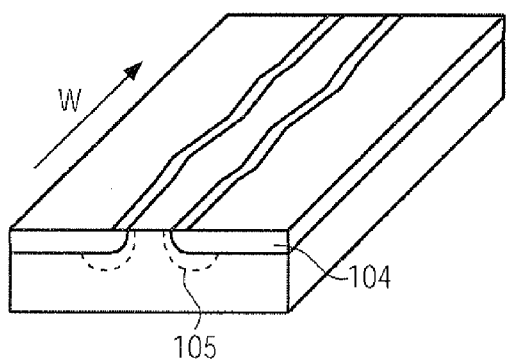
Figure 1D:
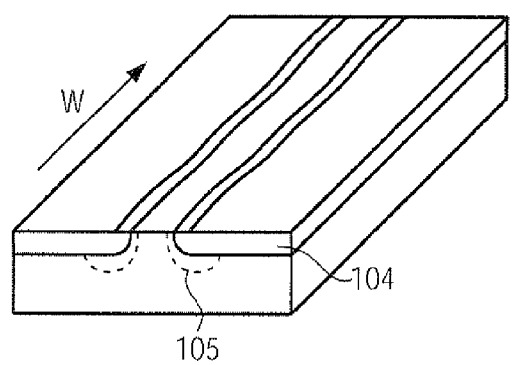

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices including transistor elements of enhanced performance, which may be accomplished by significantly reducing transistor variability caused by line edge roughness and channeling effects of a gate material. For this purpose, in some illustrative aspects, an amorphous gate material may initially be provided and may be patterned to obtain the desired gate length, at least for a certain portion of the gate material, which may then be used as an implantation mask for defining sophisticated dopant profiles without requiring dedicated offset spacers for the implantation sequence. Due to the amorphous state of the initial gate material, the line edge roughness after the patterning of the gate material as well as the channeling effect may be significantly reduced, while also the possibility of avoiding offset spacer for the implantation process may contribute to an overall enhancement of transistor characteristics. In other illustrative embodiments disclosed herein, the concept of using an amorphous gate material during the patterning and the implantation of drain and source regions and halo regions may also be applied to sophisticated high-k metal gate structures in that any high temperature processes may be performed after generating the drain and source regions on the basis of the amorphous gate material.

Figure 2A:
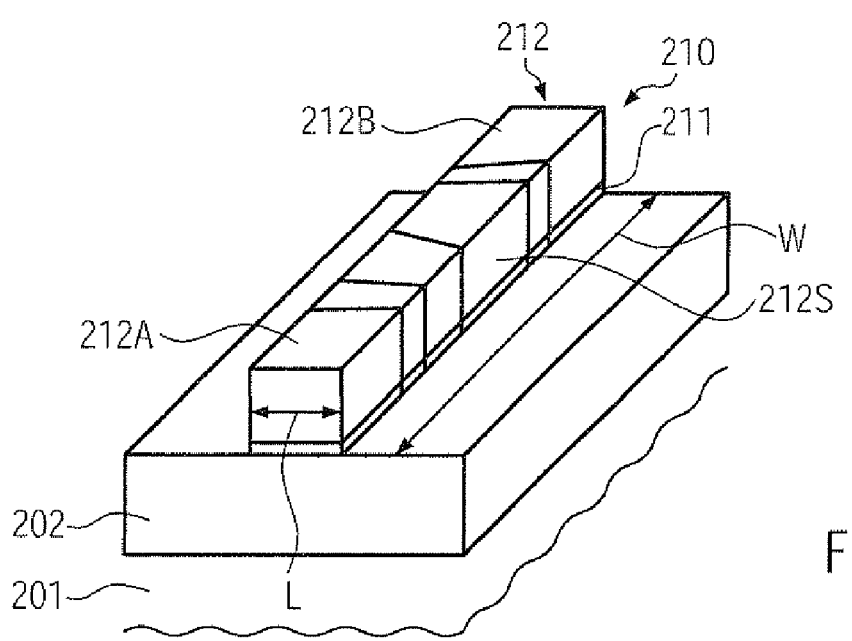
FIGS. 2a-2c schematically illustrate perspective views of a transistor device during various manufacturing stages in forming drain and source extension regions and counter-doped regions on the basis of a gate material having an amorphous state for reducing line edge roughness and channeling effects, according to illustrative embodiments.

With reference to FIGS. 2a-2q, further illustrative embodiments will now be described in more detail, wherein reference is also made to FIGS. 1a-1n in order to not unduly repeat specific manufacturing processes and strategies, if appropriate.

FIG. 2a schematically illustrates a perspective view of a transistor device 200 in a manufacturing stage in which a gate electrode structure 210 may be provided above an active region 202, i.e., a region representing a portion of a semiconductor layer, such as a silicon-based layer and the like, which in turn may be formed above an appropriate carrier material 201. It should be appreciated that the carrier material 201 in combination with the semiconductor region 202 may represent a bulk configuration, that is, the semiconductor region 202 may extend into the substrate material 201 which may thus also be provided in the form of a substantially crystalline material. In other cases, an SOI configuration may be formed by the substrate 201 and the region 202, when a buried insulating material (not shown) is positioned between these two components. The gate electrode structure 210 may comprise a gate insulation layer 211, which may comprise a high-k dielectric material, as will be described later on in more detail, or is as also explained with reference to the semiconductor device 150. Furthermore, an electrode material or gate material 212 may be formed on the gate insulation layer 211, wherein the material 212 may include a plurality of different material layers, as will be described later on, wherein at least a significant portion thereof may be provided in the form of an amorphous material, which may be understood as a material having a crystalline structure that substantially avoids significant channeling effects even on a small scale, that is, even within a width of the gate electrode structure. That is, the gate material 212 may respond to an incoming parallel ion beam such that a uniform penetration behavior may be accomplished within an extension of approximately 100 nm and less. It should be appreciated, however, that a high degree of uniformity may nevertheless be obtained across the entire width of the electrode structure 210, which may extend across several hundred nanometers in sophisticated devices, while a length, indicated as L, may be approximately 40 nm and less. It should further be appreciated that the materials 212 have "grain boundaries" in which segments of slightly different behavior may interface with each other, wherein corresponding segments 212A, 212B may have a significantly greater extension along the transistor width W compared to a polycrystalline material, as is, for instance, illustrated in FIG. 1a. Consequently, due to the significantly increased sections 212A, 212B, which may per se have a highly uniform behavior during the corresponding patterning process, a significantly reduced degree of line edge roughness may be accomplished compared to a polycrystalline material, such as polycrystalline silicon, as previously explained with reference to FIGS. 1a-1d. Hence, corresponding sidewalls 212S of the gate material 212 may exhibit a reduced variability.

The transistor device 200 as illustrated in FIG. 2a may be formed on the basis of the following processes. After forming the gate insulation layer 211, for instance by oxidation and/or deposition techniques, depending on the material composition of the layer 211, the material 212 may be deposited by using any appropriate deposition process that is appropriate for providing an amorphous material in the above-defined sense. For example, in some illustrative embodiments, the material 212 may be provided in the form of a polysilicon material, which may be accomplished by using thermally activated CVD techniques. As will be described later on in more detail, the material 212 may be converted into a polycrystalline material, such as a polycrystalline silicon, in a later manufacturing stage, thereby providing the desired enhanced conductivity when the material 212 actually serves as an electrode material. In other illustrative embodiments, any other amorphous material may be used, for instance when the gate material 212 is to be replaced by a metal-containing electrode material in a later manufacturing stage, as will be described later on. Thereafter, the corresponding patterning process may be performed, as previously described with reference to the transistor 100 and/or the transistors 100A, 100B.

Figure 2B:
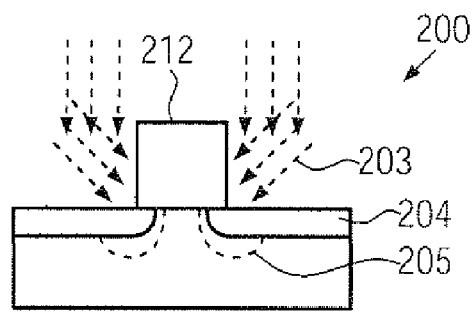

FIG. 2b schematically illustrates the transistor 200 during an implantation sequence 203, which may include tilted and non-tilted implantation steps, as previously explained. It should be appreciated that, in some illustrative embodiments, the implantation sequence 203 may be performed without forming any offset spacers on the gate material 212, that is, without depositing a spacer material and/or without performing an oxidation process, which may conventionally contribute to additional variability. Although superior surface topography of the sidewalls 212S (FIG. 2a) may be accomplished due to the amorphous state of the material 212, omission of providing an additional offset spacer avoids any further length variation of the material 212, which may be caused by any processes, such as oxidation, deposition and the like, which may conventionally be required for forming an offset spacer element. Furthermore, due to the amorphous nature of the material 212, any channeling effects may be significantly reduced or substantially completely avoided. Thus, corresponding drain and source extension regions 204 and counter-doped or halo regions 205 may be accomplished with a reduced degree of variability compared to conventional approaches.

Figure 2C:
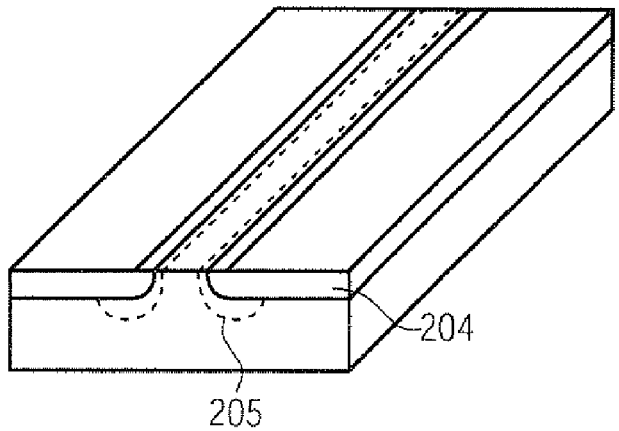

FIG. 2c schematically illustrates the transistor 200 after the above-described process sequence wherein, for convenience, the gate electrode structure 210 is not shown in FIG. 2c. As illustrated, the implantation profile of the regions 204, 205 may exhibit a significantly reduced variability, thereby contributing to enhanced transistor performance, as is also previously discussed. Consequently, the further processing may be continued, for instance, by providing additional performance increasing mechanisms, such as the provision of an embedded strain-inducing semiconductor alloy, as will be described later on in more detail, and by forming drain and source regions wherein additional high temperature processes may result in a conversion of the amorphous material 212 into a polycrystalline material, such as polycrystalline silicon material, thereby providing a high degree of compatibility with conventional strategies if the polycrystalline nature of the material 212 may have a significant influence on the overall device performance.

With reference to FIGS. 2d-2u, further illustrative embodiments will now be described in which high-k metal gate electrode structures may be formed on the basis of an amorphous gate material without requiring dedicated implantation offset spacer elements, while in some illustrative embodiments even a sidewall liner may be omitted, which may conventionally be required for ensuring integrity of a high-k gate dielectric material.

FIGS. 2d and 2e schematically illustrate a semiconductor device 250 in cross-sectional view according to specific manufacturing stages, wherein a high-k metal gate structure is to be formed for two different transistors based on an approach for providing a metal-containing electrode material in an initial state (FIG. 2d) and according to an approach in which gate material may be replaced in a later manufacturing stage (FIG. 2e). Consequently, in this manufacturing stage, the semiconductor device 250 of FIG. 2d may comprise a first transistor 200A and a second transistor 200B that are formed in and above corresponding active regions 202A, 202B. In one illustrative embodiment, the transistor 200A may represent an N-channel transistor, while the transistor 200B may represent a P-channel transistor. Furthermore, a gate electrode structure 210A may comprise the gate insulation layer 211, which may include a high-k dielectric material, as previously discussed, possibly in combination with a "conventional" dielectric material, such as silicon dioxide and the like. Furthermore, a metal-containing electrode material 212O may be formed on the high-k gate insulation layer 211 and may have any appropriate material composition so as to define an appropriate work function for the gate structure 210A. Additionally, a conductive barrier material 212P, for instance in the form of a titanium nitride material and the like, may be provided, followed by amorphous gate material 212Q, which, in some illustrative embodiments, may be provided in the form of an amorphous silicon material. Similarly, a gate electrode structure 210B of the transistor 200B may have substantially the same configuration wherein, additionally, a channel semiconductor alloy 202C may be provided so as to adjust the required band gap offset, as previously explained. Furthermore, in some illustrative embodiments, the gate electrode structures 210A, 210B may comprise a cap material 214, such as a silicon nitride material and the like, depending on the overall process strategy.

Similarly, the semiconductor device 250 in FIG. 2e may comprise gate electrode structures 210A, 210B in an appropriate configuration for enabling removal of the gate material 212Q in a later manufacturing stage, wherein the high-k gate insulation layer 211 may be protected by the metal-containing conductive barrier material 212P, as is also previously discussed with reference to the semiconductor device 150. Furthermore, in the manufacturing stage shown, the gate electrode structures 210A, 210B of FIGS. 2d and 2e may have formed on sidewalls thereof a sidewall liner 213, which may in combination with the materials 212O and/or 212P provide confinement of the high-k gate insulation material 211, thereby ensuring integrity thereof during any subsequent wet chemical etch processes.

The semiconductor device 250 of FIGS. 2d and 2e may be formed on the basis of similar process techniques as previously described, wherein, however, the material 212Q may be provided in the form of an amorphous state, irrespective of the remaining configuration of the gate electrode structures 210A, 210B. Furthermore, if desired, the cap layer 214 may be provided, for instance, by depositing an appropriate material layer, such as a silicon nitride layer, on top of material 212Q and patterning the layer 214 on the basis of corresponding techniques, as previously described. Thus, in any case, the gate material 212Q may exhibit a superior configuration with respect to line edge roughness, as previously discussed, thereby also enhancing process conditions during the deposition of a corresponding material layer for the liner 213 so that the liner 213 may not unduly contribute an increased line edge roughness.

FIGS. 2f and 2g schematically illustrate the semiconductor device 250 in a further advanced manufacturing stage. As illustrated, the device 250 may be subjected to the ion implantation sequence 203, which may be performed on the basis of appropriately selected process parameters, which may take into consideration the configuration of structures 210A, 210B. That is, contrary to conventional approaches, specifically dedicated offset spacers may not be provided, thereby enhancing overall performance of the various implantation steps during the sequence 203. Furthermore, the material 212Q is still in an amorphous state, thereby reducing any channeling effects which may, therefore, contribute to enhanced uniformity of corresponding drain and source extension regions 204A, 204B and halo regions 205A, 205B. It should be appreciated that the sequence 203 may include several masking steps which may thus require the provision of resist masks and their removal, which may possibly be based on specific wet chemical etch recipes, during which the liner 213 may reliably protect the sensitive high-k insulation layer 211. It should further be appreciated that an appropriate adaptation of implantation parameters for the transistors 210B may take into consideration a subsequent removal of material of the corresponding active regions 202B, if an embedded semiconductor alloy has to be provided in view of further enhancing overall transistor performance.

FIGS. 2h and 2i schematically illustrate the semiconductor device 250 in a further advanced manufacturing stage corresponding to FIGS. 2f and 2g, respectively. As illustrated, a mask layer 207 may be formed above the transistors 210A, while a corresponding spacer element 207B may be formed on sidewalls of the gate electrode structures 210B, i.e., on the corresponding sidewall liners 213. The mask layer 207 and the spacer 207B may be comprised of any appropriate material, such as silicon nitride and the like. Furthermore, a strain-inducing semiconductor alloy 208 may be formed in the active regions 202B so as to produce an appropriate strain component, as previously explained with reference to the device 150.

The device 250 as shown in FIGS. 2h and 2i may be formed by depositing the mask layer 207 and patterning the same on the basis of an appropriate resist mask or any other etch mask so as to obtain the spacer 207B while maintaining the mask layer 207 above the transistor 200A. For example, appropriate deposition and patterning techniques may be used for this case, for instance as previously described with reference to the components 107, 107B (FIG. 1k). It should be appreciated that any high temperature during the corresponding manufacturing sequence may convert the material 212Q (FIGS. 2f, 2g) into a poly-crystalline material, which is now indicated as material 212. Thereafter, a cavity etch process may be performed to remove material of the active regions 202B, wherein the mask layer 207 and the spacer element 207B, possibly in combination with the cap layer 214, may act as an etch mask. Thereafter, a selective epitaxial growth process may be performed to fill the previously formed cavities with the semiconductor alloy 208, which may be accomplished on the basis of well-established process techniques. Thereafter, the mask layer 207 and the spacer element 207B may be removed and the further processing may be continued by forming drain and source regions.

FIG. 2*j* schematically illustrates the semiconductor device 250 in a further advanced manufacturing stage starting from the stage as shown in FIG. 2*h*. In this manufacturing stage, drain and source regions 209 may be provided and may, in combination with the extension regions 204, laterally enclose a channel region 219. Furthermore, a spacer structure 220 may be formed on sidewalls of the gate electrode structures 210A, 210B, wherein, depending on the complexity of the lateral and vertical dopant profile of the drain and source regions 209, one or more spacer elements 221 may be provided in combination with an etch stop liner material 222. For example, the spacer element 221 may be comprised of silicon nitride, while the liner 222 may be comprised of silicon dioxide, wherein, however, any other material composition may be used. Thus, the gate electrode structures 210A may comprise the insulation layer 211, the metal-containing electrode material 212O, the conductive barrier material 212P and the polycrystalline gate material 212. Additionally, in the transistor 200B, the channel semiconductor alloy 202C may ensure a proper adaptation of the band gap of the channel region 219 to the work function of the material 212O. The semiconductor device 250 may be formed on the basis of well-established process techniques, for instance by forming the spacer structure 220 and performing corresponding implantation processes to define the desired dopant profile for the drain and source regions 209. Thereafter, any anneal cycles may be performed in order to activate dopants and re-crystallize implantation-induced damage. The further processing of the device 250 may be continued, for instance forming metal silicide regions in the drain and source regions 209 and possibly in the gate material 212, followed by the deposition of an interlayer dielectric material and patterning the same in accordance with device and process requirements.

FIG. 2*k* schematically illustrates the semiconductor device 250 in a further advanced manufacturing stage when starting from the configuration as shown in FIG. 2*i*. As illustrated, the transistor 200B may comprise the gate electrode structure 210B with a gate material 212 replaced by a metal-containing electrode material 216B, which may provide an appropriate work function for the transistor 200B. For this purpose, titanium, aluminum and any combinations thereof, in combination with respective alloys, may be used to obtain the desired work function and thus threshold adjustment for the transistor 200B. Furthermore, a dielectric layer 230B, for instance in the form of a silicon nitride material, a nitrogen-containing silicon carbide material and the like, may be provided, possibly in a highly stressed state so as to further enhance performance of the transistor 200B. Furthermore, a further dielectric material 231, such as a silicon dioxide material, may be formed by laterally enclosing the gate electrode structure 210B. On the other hand, the gate electrode structure 210A of the transistor 200A may comprise an opening 215 that may extend down to the conductive barrier material 212P. For this purpose, an appropriate etch mask 223, such as a resist mask, may be provided on the basis of which the material 212 (FIG. 2*i*) may be removed selectively to the materials 213 and 212P. For this purpose, well-established plasma assisted or wet chemical etch recipes are available.

It should be appreciated that a corresponding opening may have previously been formed in the gate electrode structure 210B and may subsequently be filled by depositing the electrode material 216B using any appropriate deposition technique. Thereafter, any excess material may be removed, for instance by chemical mechanical polishing (CMP) and the like, thereby providing a substantially planar surface topography for forming the etch mask 223. Moreover, it should be appreciated that the materials 230B, possibly in combination with a dedicated dielectric material 230A, which may be provided in a highly stressed state so as to enhance performance of the transistor 200A, and the dielectric material 231 may be formed in accordance with well-established process techniques. Hence, after removal of the etch mask 223, an appropriate metal-containing electrode material may be filled into the opening 215 so as to obtain a desired work function for the electrode structure 210A. Thereafter, any excess material may be removed, for instance by CMP and the like, and the further processing may be continued by depositing a further dielectric material and patterning the same to form corresponding contact elements. It should be appreciated that, prior to forming the dielectric materials 230A, 230B and 231, corresponding metal silicide regions (not shown) may be formed, if required.

Consequently, a highly efficient manufacturing flow may be accomplished for both an approach with an early provision of metal-containing electrode material and a replacement gate approach on the basis of an amorphous gate material, whose amorphous state may be preserved at least during an implantation sequence for forming the drain and source extension regions in combination with halo regions. Hence, superior transistor performance due to a reduced profile variability of a sophisticated dopant profile may be accomplished.

With reference to FIGS. 2*l*-2*u*, further illustrative embodiments will now be described in which profile variability may further be reduced by omitting a sidewall liner that may be provided for preserving integrity of a sensitive high-k dielectric material.

Figure 1E:
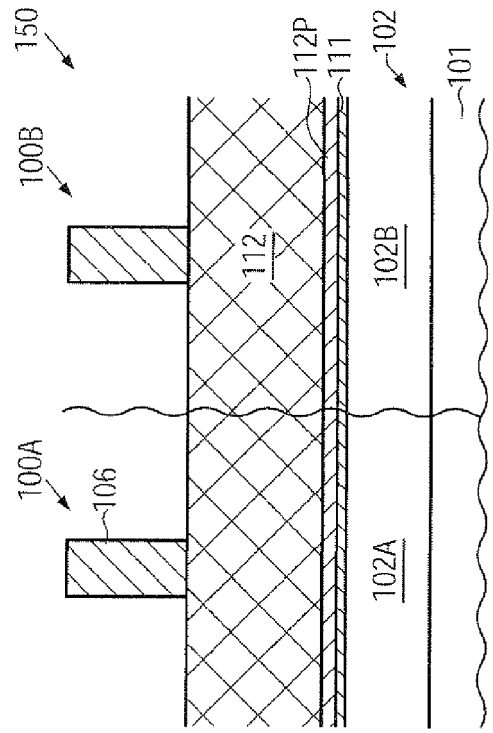
Figure 1F:
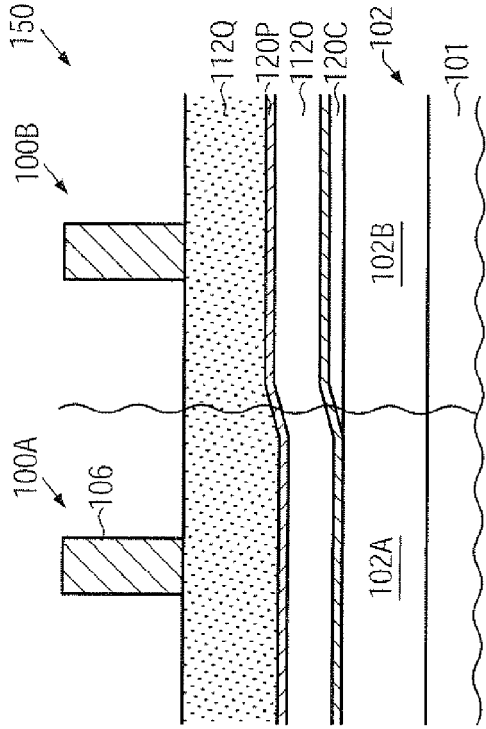
Figure 1G:
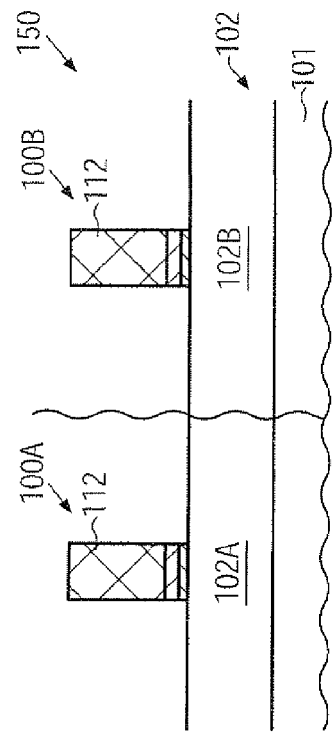
Figure 1H:
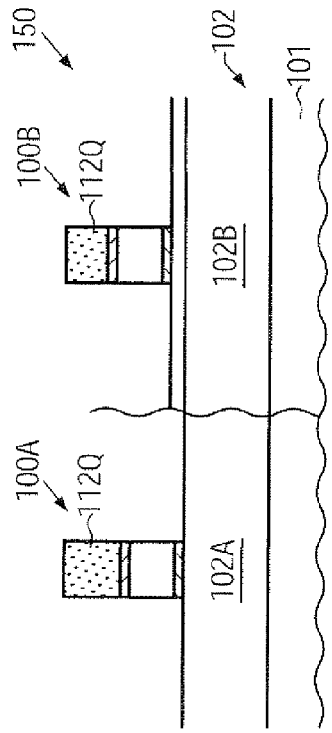

FIGS. 2*l* and 2*m* schematically illustrate the semiconductor device 250 when exposed to an etch process 224 that may be designed so as to etch material of the gate material 212Q selectively to the conductive barrier material 212P. Hence, as illustrated, an etch mask 206 may be provided so as to define the lateral size and position of the gate electrode structures 210A, 210B, as is also previously discussed with reference to the device 150 when referring to FIGS. 1*e* and 1*f*. During the etch process 224, the metal-containing barrier material 212P may be used as an etch stop layer, thereby preserving integrity of the metal gate electrode material 212O according to FIG. 2*l* and maintaining integrity of the gate insulation layer 211 according to embodiments shown in FIG. 2*m*. After the etch process 224, the etch mask 206 may be removed wherein, as previously indicated, in particular the gate insulation layer 211 may be protected with respect to any wet chemical etch recipe, at least by the layer 212P.

FIGS. 2*n* and 2*o* schematically illustrate the semiconductor device 250 in a further advanced manufacturing stage in which the implantation sequence 203 may be performed by using the patterned gate material 212Q, which is still in an amorphous state, as an implantation mask. Consequently, in the semiconductor device 250 as shown in FIG. 2*n*, corresponding implantation parameters, such as energy and dose, may be appropriately adapted so as to implant a corresponding implantation species through the layers 211, 212O and 212P in order to obtain the required profile for the drain and source extension regions 204A, 204B and the counter-doped regions 205A, 205B. A corresponding adaptation may readily be established on the basis of simulation calculations and/or experiments starting with conventional implantation recipes. Since the layers 211, 212O, 212P may have a thickness in total of several nanometers, a corresponding adaptation may not require significant changes of conventional recipes. Similarly, in the device 250 as illustrated in FIG. 2*o*, the implantation sequence 203 may implant the implantation species through the layers 212P and 211, which may also be accomplished on the basis of an appropriate adaptation. Thus, also in this case, superior performance of the implantation processes and thus of the resulting dopant profiles may be accomplished due to the superior characteristics of the material 212Q acting as an implantation mask. It should further be appreciated that, during the corresponding masking sequence for forming and removing respective implantation masks, integrity of the high-k dielectric layer 211 may be preserved by at least the layer 212P.

FIGS. 2p and 2q schematically illustrate the semiconductor device 250 corresponding to the devices of FIGS. 2n and 2o, respectively, in a further advanced manufacturing stage. As illustrated, the device 250 is exposed to a further etch ambient 225 during which the layers 212P, 212O and 211 of the device 250 of FIG. 2p may be patterned while using the material 212Q as an etch mask. Similarly, in the device 250 of FIG. 2q, the layers 212P and 211 may be patterned by using the material 212Q as an etch mask. The etch process 225 may be performed on the basis of any appropriate etch recipe, for instance by using well-established techniques in which a corresponding stack of layers may have to be patterned in sophisticated approaches, as previously described with reference to the semiconductor device 150. Thereafter, the further processing may be continued without requiring any critical wet chemical cleaning processes so that integrity of an exposed sidewall portion 211S of the high-k dielectric material 211 may not be at risk.

FIGS. 2r and 2s schematically illustrate the device 250 in a further advanced manufacturing stage. As illustrated, the mask layer 207 and the spacer element 207B may be provided, for instance, on the basis of manufacturing techniques as previously discussed. Thus, by providing the mask layer 207 and the spacer element 207B, the layer 211 may be encapsulated, thereby preserving integrity thereof during the further processing. Consequently, a dedicated deposition of a sidewall liner material, such as the liners 113 and 213 as previously described, may not be required, thereby contributing to enhanced uniformity during the patterning of the drain and source extension regions 204A, 204B and halo regions 205A, 205B, since any deposition and patterning-related non-uniformities for forming the corresponding sidewall liner may be avoided. It should be appreciated that, if required, the spacer 207B may be maintained throughout the further processing, in which case a selective anisotropic etch process may be performed so as to also form a corresponding spacer element for the gate electrode structures 210A. In other cases, the mask layer 207 and the spacer 207B may be removed, which may be accomplished with non-critical etch recipes and thereafter the further processing may be continued by forming a sidewall spacer structure and may be used for further implantation processes, thereby also encapsulating the sensitive material layers 211. Thereafter, the further processing may be continued on the basis of similar process techniques, as previously described.

FIG. 2t schematically illustrates the semiconductor device 250 in a stage in which the drain and source regions 209 are completed, possibly in combination with metal silicide regions (not shown). Furthermore, the gate electrode structures 210A may comprise the material 212 in a substantially polycrystalline state due to any high temperature treatment, for instance applied during the deposition of the mask layer 207 (FIGS. 2r, 2s) or any subsequent anneal processes for forming the drain and source regions 209. Moreover, the spacer structure 220, which may include the etch stop liner 222, may be formed on sidewalls of the electrode structures 210A, 210B, wherein, due to the missing sidewall liner such as the liners 113, 213 as previously explained, the liner 222 may be directly formed on the material 212 and on the sidewall 211S of the gate insulation layer 211.

Similarly, FIG. 2u schematically illustrates the device 250 according to the replacement gate approach in which appropriate metal-containing electrode materials 216B, 216A may be formed in the structures 210B, 210A, respectively, for instance on the basis of a process technique as previously described with reference to FIG. 2k. Also in this case, the etch stop liner 222 may be formed directly on the materials 216B, 216A, respectively, and may also directly connect to the sidewall 211S of the gate insulation layer 211.

As a result, the present disclosure provides semiconductor devices and corresponding manufacturing techniques in which dopant profile variability may be significantly reduced by providing an amorphous gate material that may act as an efficient implantation mask, thereby providing the possibility of omitting dedicated offset spacer elements, which may conventionally contribute to a pronounced line edge roughness. Furthermore, in addition, in some illustrative embodiments a further enhancement of gate uniformity may be accomplished by omitting a sidewall liner and ensuring integrity of the sensitive high-k dielectric material on the basis of an appropriately designed patterning sequence in which a portion of the gate material may be used as an implantation mask while preserving integrity of the high-k dielectric material, which may be patterned in a further etch sequence after performing the critical implantation sequence.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate insulation layer above a semiconductor layer;
    forming a conductive barrier material above said gate insulation layer;
    forming a layer of gate material above said conductive barrier material, said gate material being in an amorphous state;
    forming an etch mask above said layer of gate material;
    performing an etching process through said etch mask on said layer of gate material using said conductive barrier material as an etch stop material to thereby form a gate electrode structure of a transistor above said semiconductor layer;
    forming a portion of drain and source regions of said transistor by using said gate material in the amorphous state as an implantation mask; and
    performing one or more processes so as to complete said transistor.

2. The method of claim 1, further comprising forming an embedded semiconductor alloy in said semiconductor layer by performing an epitaxial growth process after forming said portion of the drain and source regions.

3. The method of claim 1, wherein forming said gate electrode structure comprises forming a high-k dielectric material above said semiconductor layer and below said conductive barrier material.

4. The method of claim 3, further comprising forming a liner on exposed sidewalls of said amorphous material and on said exposed sidewalls of said conductive barrier material and said high-k dielectric material while preserving said amorphous state of said gate material.

5. The method of claim 3, further comprising replacing said gate material by a metal-containing electrode material.

6. The method of claim 3, further comprising forming at least one metal-containing electrode material layer above said high-k dielectric material and forming said conductive barrier material on said at least one metal-containing electrode material layer.

7. The method of claim 6, further comprising forming a threshold adjusting semiconductor material on said semiconductor layer prior to forming said high-k dielectric material.

8. The method of claim 1, wherein forming said portion of the drain and source regions comprises performing a sequence of implantation processes so as to introduce one or more dopant species into said semiconductor layer through said conductive barrier material and said high-k dielectric material.

9. The method of claim 8, further comprising patterning said conductive barrier material and said high-k dielectric material by performing an etch process using said gate material as an etch mask and forming a sidewall spacer on said gate electrode structure.

10. The method of claim 9, further comprising forming an embedded semiconductor alloy in said semiconductor layer on the basis of said sidewall spacer.

11. The method of claim 1, wherein said gate material comprises silicon.

12. The method of claim 11, further comprising converting said amorphous state of said gate material into a polycrystalline state when performing said one or more processes for completing said transistor.

13. A method, comprising:
forming a gate electrode structure by forming an amorphous gate material above a high-k dielectric material formed above a semiconductor layer of a semiconductor device, wherein forming said gate electrode structure comprises forming a conductive barrier material above said high-k dielectric material, forming an etch mask above a layer of said gate material and etching said layer of gate material on the basis of said etch mask and using said conductive barrier material as an etch stop material;
forming a portion of drain and source regions of a transistor in said semiconductor layer by using said amorphous gate material as an implantation mask; and
performing a plurality of processes for finishing a final configuration of said transistor.

14. The method of claim 13, wherein forming said gate electrode structure comprises patterning said amorphous gate material on the basis of said etch mask while avoiding exposure of said high-k dielectric material.

15. The method of claim 14, wherein forming said portion of said drain and source regions comprises implanting one or more types of dopant species through said high-k dielectric material while using said patterned amorphous gate material as an implantation mask.

16. The method of claim 13, wherein forming said gate electrode structure comprises patterning said amorphous gate material and said high-k dielectric material on the basis of said etch mask and forming a sidewall liner on exposed sidewall portions of said patterned amorphous gate material and said patterned high-k dielectric material while preserving an amorphous state of said gate material.

17. The method of claim 13, further comprising forming a strain-inducing semiconductor alloy in said semiconductor layer after forming said portion of the drain and source regions.

18. The method of claim 13, further comprising replacing said gate material by a metal-containing electrode material after forming drain and source regions of said transistor.

19. The method of claim 13, wherein forming said gate electrode structure comprises forming a metal-containing material on said high-k dielectric material and forming at least one metal-containing electrode material on said metal-containing material.

* * * * *